(12) United States Patent
Kwon et al.

(10) Patent No.: US 6,449,960 B1
(45) Date of Patent: Sep. 17, 2002

(54) OPTICAL DEVICE MODULE HAVING HEAT TRANSFER MEDIUM VIA PHASE TRANSFORMATION

(75) Inventors: Oh-Dal Kwon, Suwon-shi; Tae-Gyu Kim, Yongin-shi; Hyung-Seung Song, Songnam-shi; Yong-Wook Won, Anyang-shi, all of (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/949,906

(22) Filed: Sep. 10, 2001

(30) Foreign Application Priority Data

Jan. 30, 2001 (KR) .......................................... 2001-4278

(51) Int. Cl.[7] ................................................ F25B 21/02
(52) U.S. Cl. ......................... 62/3.7; 62/259.2; 165/80.4
(58) Field of Search ............................... 62/32, 33, 3.6, 62/3.7, 259.2; 165/80.4

(56) References Cited

U.S. PATENT DOCUMENTS

| | | | | |
|---|---|---|---|---|
| 3,940,621 A | * | 2/1976 | Fletcher et al. ............. | 250/335 |
| 5,070,936 A | * | 12/1991 | Carroll et al. ............. | 165/80.4 |
| 5,363,391 A | * | 11/1994 | Matthews et al. ............ | 372/36 |
| 5,523,563 A | * | 6/1996 | Moessner .................... | 250/238 |
| 6,298,669 B1 | * | 10/2001 | Maruyama et al. ........... | 62/3.2 |

* cited by examiner

Primary Examiner—Denise L. Esquivel
Assistant Examiner—Melvin Jones
(74) Attorney, Agent, or Firm—Steve Cha; Klauber & Jackson

(57) ABSTRACT

Disclosed is an optical device module having a heat transfer medium via a phase transformation for overcoming the non-uniform temperature distribution. The optical device module includes an optical device that requires temperature control; a temperature sensor for detecting the temperature of the optical device; a heat source for generating heat; and, a heat transfer medium, disposed between the heat source and the optical device, with a number of heat pipes inside thereof.

14 Claims, 3 Drawing Sheets

OPTICAL DEVICE MODULE HAVING HEAT TRANSFER MEDIUM VIA PHASE TRANSFORMATION

This application makes reference to and claims all benefits accruing under 35 U.S.C. Section 119 from an application entitled "OPTICAL DEVICE MODULE HAVING HEAT TRANSFER MEDIUM VIA PHASE DEFORMATION," filed with the Korean Industrial Property Office on Jan. 30, 2001 and there duly assigned Ser. No. 2001-4278.

BACKGROUND OF THE INVENTION

1. Field of the Invention

The present invention generally relates to a technique of manufacturing an optical device module which requires temperature control, and more particularly to an optical device module having a heat transfer medium for overcoming non-uniform temperature distribution.

2. Description of the Related Art

In the manufacturing stage of an optical device, it is necessary to control temperature for the stability of wavelengths as the temperature gradient in the optical device causes optical loss as well as wavelength variation. Thus, temperature should be uniformly distributed across the whole device. Accordingly, designs of a heat source and a heat dispersing plate have been considered important.

A conventional method of controlling the temperature of the optical device utilizes a heat source and a sensor in which the sensor reads the surface temperature of the optical device for providing a return control. The heat source and the heat-detecting sensor are typically coupled to the surface of the optical device. However, temperature distribution of the heat source and surface temperature fluctuates due to the unstable current supplied thereto. To address this problem, a heat transfer plate is installed between the heat source and the optical device so that the heat is transmitted from the heat source to the optical device through the heat transfer plate to control the temperature. To this end, a temperature sensor between the heat transfer plate and the optical device is provided to transmit a return control signal indicative of the current temperature of the device.

Despite the above attempts, a temperature gradient still exists across the heat transfer plate due to the size difference between the heat source and the heat transfer plate, thereby causing the temperature of the optical device to be distributed non-uniformly. As a result, the refractive index of the optical device or wavelength stability is influenced by the temperature gradient and degrades the performance of the optical device.

SUMMARY OF THE INVENTION

The present invention has been proposed to solve the foregoing problems of the related art. Accordingly, the present invention is directed to an optical device module for preventing the degradation of an optical device due to non-uniform temperature distribution in the heat transfer plate, thus ensuring optimal performance by the optical device.

According to an aspect of the present invention, there is provided an optical device module with a heat transfer medium via phase transformation which includes an optical device that requires temperature control; a temperature sensor for detecting the temperature of the optical device; a heat source for generating heat; and, a heat transfer medium disposed between the heat source and the optical device with a number of heat pipes inside thereof.

BRIEF DESCRIPTION OF THE DRAWINGS

A more complete understanding of the method and apparatus of the present invention may be had by reference to the following detailed description when taken in conjunction with the accompanying drawings wherein.

DETAILED DESCRIPTION OF THE PREFERRED EMBODIMENT

In the following description, for purposes of explanation rather than limitation, specific details are set forth such as the particular architecture, interfaces, techniques, etc., in order to provide a thorough understanding of the present invention. For purposes of simplicity and clarity, detailed descriptions of well-known devices, circuits, and methods are omitted so as not to obscure the description of the present invention with unnecessary detail.

Figure 1:
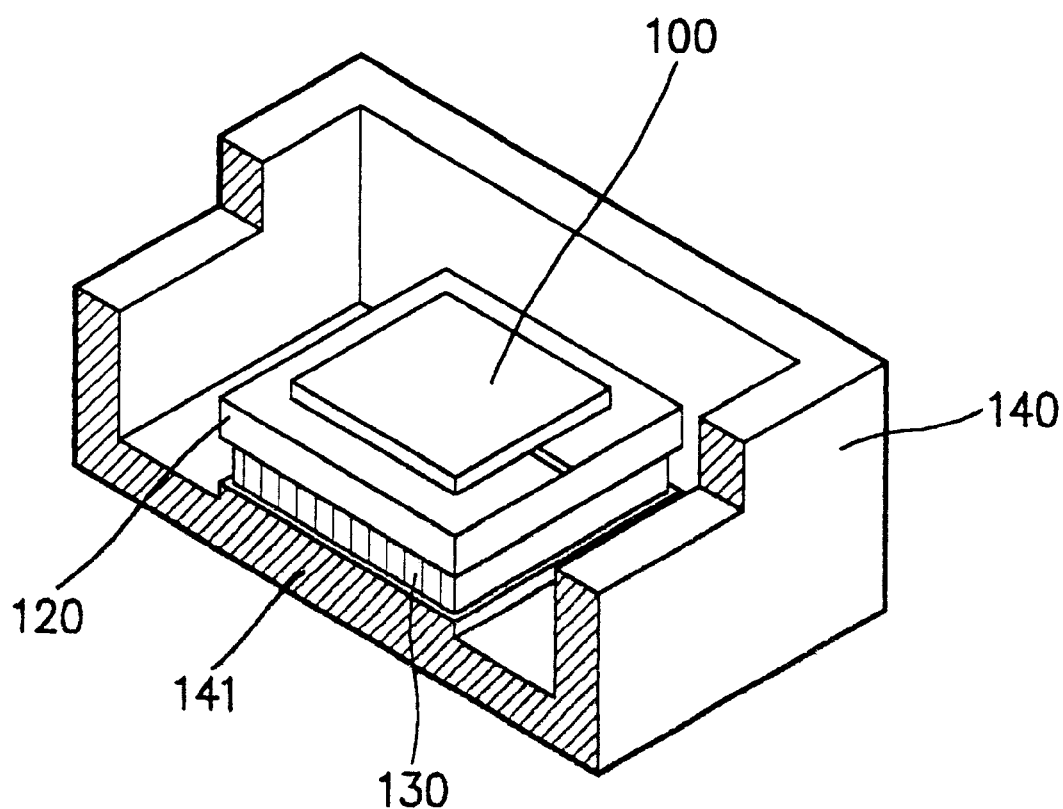
FIG. 1 shows a schematic perspective view of an optical device module according to the present invention.
Figure 2:
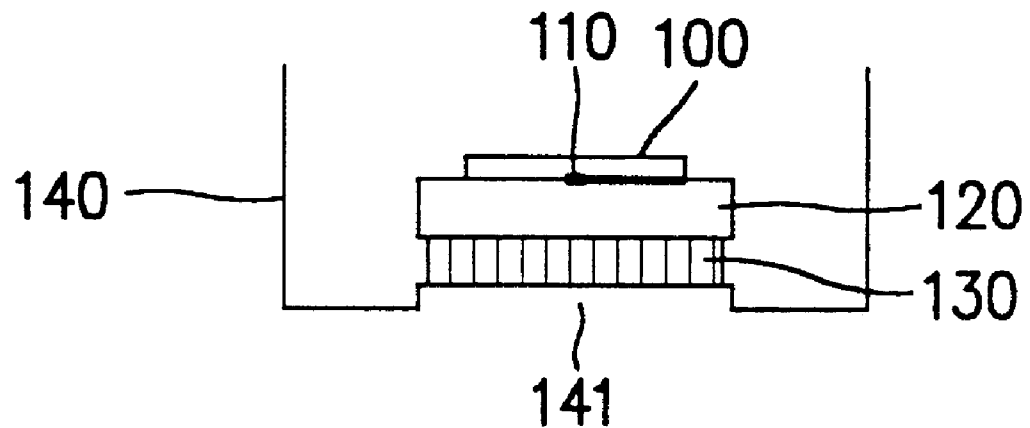
FIG. 2 is a side structural view of the optical device module shown in FIG. 1; and, FIG. 3 is the structural view of a heat transfer medium according to an embodiment of the present invention displaced in the optical device module shown in FIG. 1.
Figure 3:
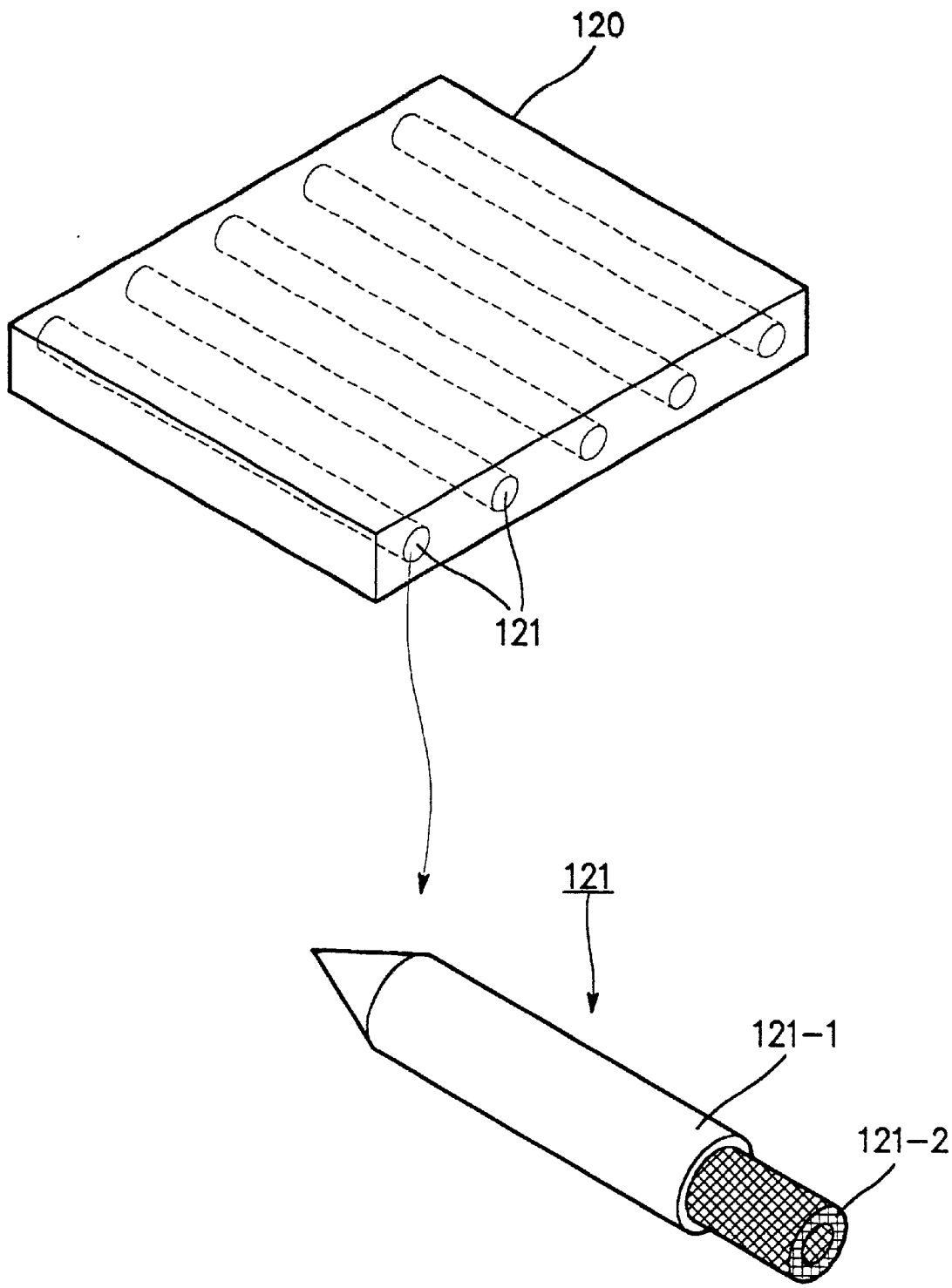

Now, a description will be made in detail regarding this invention with reference to the drawings. FIG. 1 shows a schematic perspective view of an optical device module according to the present invention. FIG. 2 is a side structural view of the optical device module shown in FIG. 1. FIG. 3 is a structural view of a heat transfer medium according to an embodiment of the invention of the optical device module shown in FIG. 1.

Referring to FIG. 1 to FIG. 3, the optical device module according to the present invention includes an optical device 100, which requires temperature control, a temperature sensor 110, a heat transfer plate 120, a heat source 130, a housing 140, and a mount 141. In addition, lead lines (not shown) are provided for applying voltage or current to activate the heat source 130. The optical device 100, the heat transfer plate 120, the heat source 130 and the mount 141 are attached together using a medium, such as thermal grease, or by soldering. The heat source 130 may include a thermo electric cooler (TEC), which is a well-known device to those skilled in this art. The TEC has the shape of a module in which n-type and p-type thermoelectric semiconductors are electrically connected in series, while being thermally connected in parallel. Thus, when a DC current is applied to the heat source 130, a temperature difference takes place due to the thermoelectric effect.

According to the embodiment of the present invention, the heat transfer plate 120 utilizes a particular fluid to enter a phase transformation (explained later), and may include an array of heat pipes arranged in parallel, for example, four or five heat pipes 121, as shown in FIG. 3. The heat transfer plate 120 has holes extended through the inside thereof to fit the outer configuration of the heat pipes 121 so that the heat pipes 121 can be assembled into these holes.

Each of the heat pipes 121 is comprised of a sealed vessel 121-1 containing a working fluid within the same, and wicks 121-2 provided within each heat pipe 121 for condensing the working fluid and for evaporating the condensed working fluid. The sealed vessel 121-1 is preferably made of a material with excellent thermal conductivity. Each of the heat pipes 121 contains the working fluid within its sealed vessel 121-1 which transfers heat between both sides of the vessel that is a cool side and a hot side through phase transformation, in which heat is transferred by using latent heat. Hence, the heat pipes 121 have a heat transferring capability that is much greater compared to the typical heat transferring devices that use a single phase of a working fluid. It is noted that the heat pipes 121 perform differently depending on the types of materials for the outer wall, working fluid, structures of the wicks, returning scheme of fluid, geometry of the inside, working temperature, and the like.

For coupling the optical device 100, the temperature sensor 110, the thermal transfer plate 120, and the heat source 130 together within the housing 140, a medium such as thermal grease or solder that require a proper rubbing action to enhance close adhesion between the contacting surfaces is used. In addition, four electric wires (not shown), including two wires for the temperature sensor 110 that are connected to a temperature control circuit externally and two wires for use in connection with the heat source 130, are provided. These four electric wires are pin-treated, and a number of pin holes are formed in the housing 140 corresponding to the four pins so that the pins can fit in the pin holes.

Now, a detailed description will be made of a heat transferring operation by using the heat transfer plate 120 of the above structure.

First, when a current is supplied to the heat source 130 through the pin-treated electric wires, the heat source 130 generates heat, which is transferred to the inside of the heat pipes 121 in the heat transfer plate 120.

As heat is transferred, the working fluid condensed inside the wicks 121-2, after being injected into the heat pipes 121, is evaporated and distributed into the heat pipes 121. Such evaporated working fluid uniformly heats the heat transfer plate 120. That is, after being evaporated by heat in the heat pipes 121, the working fluid transfers heat to the optical device through the outer contour of the heat transfer plate 120, and thereafter cooled and condensed back in the wicks 121-2. After being cooled into liquid, the working fluid is injected back into the heat pipes 121. The foregoing steps of evaporation are repeated via the heat source 130 to transfer heat to the optical device 100. When the temperature is controlled through the transfer of thermal energy via the phase transformation of the working fluid, temperature distribution of the heat transfer plate 120 becomes evenly uniform. Thus, the temperature distribution of the optical device 100 can also exhibit almost the same heat distribution as the heat transfer plate 120.

According to the present invention as described above, the heat pipes 121 using a heat transfer medium or working fluid via phase transformation is provided in the heat transfer plate 120 to uniformly maintain the temperature distribution of the optical device 100. Accordingly, the performance degradation of the optical device due to non-uniform temperature distribution in the prior art system can be prevented.

While the preferred embodiments of the present invention have been illustrated and described, it will be understood by those skilled in the art that various changes and modifications may be made, and equivalents may be substituted for elements thereof without departing from the true scope of the present invention. In addition, many modifications-may be made to adapt to a particular situation and the teaching of the present invention without departing from the central scope. Therefore, it is intended that the present invention not be limited to the particular embodiment disclosed as the best mode contemplated for carrying out the present invention, but that the present invention include all embodiments falling within the scope of the appended claims.

What is claimed is:

1. An apparatus for controlling the heat distribution of an optical device, comprising:
   a housing;
   a temperature sensor for sensing the temperature of said optical device inside said housing;
   a heat source installed inside said housing for generating heat; and,
   a heat transfer medium, disposed between said heat source and said optical device, having a plurality of heat pipes in parallel located inside thereof.

2. The apparatus according to claim 1, wherein each of said optical device, said heat transfer medium, and said heat source is coupled to each other via thermal grease or solder.

3. The apparatus according to claim 1, wherein said heat source is composed of a temperature electric cooler (TEC).

4. The apparatus according to claim 1, further comprising a number of electric wires that are pin-treated for use in connection with supplying voltage to said temperature sensor and said heat source.

5. An apparatus for controlling the heat distribution of an optical device, comprising:
   a housing;
   a temperature sensor for sensing the temperature of said optical device inside said housing;
   a heat source mounted in a substantially horizontal orientation inside said housing for generating heat; and,
   a heat transfer medium, disposed between said heat source and said optical device, having an array of heat pipes located inside thereof.

6. The apparatus according to claim 5, wherein each of said optical device, said heat transfer medium, and said heat source is coupled to each other via thermal grease or solder.

7. The apparatus according to claim 5, wherein said heat source is composed of a temperature electric cooler (TEC), said TEC includes, in succession, a number of n-type and p-type thermoelectric semiconductors in series and thermally connected in parallel.

8. The apparatus according to claim 5, wherein said heat transfer plate includes a number of holes extended through the inside thereof for receiving said heat pipes.

9. The apparatus according to claim 5, wherein in each of said heat pipes comprises a sealed vessel containing a working fluid and wicks, said wicks provide for condensing said working fluid and for evaporating said condensed working fluid in response to said generated heat.

10. The apparatus according to claim 9, wherein said sealed vessel contains material that has thermal conductivity.

11. The apparatus according to claim 5, further comprising a number of electric wires that are pin-treated for use in connection with supplying voltage to said temperature sensor and said heat source.

12. A method for controlling the heat distribution of an optical device, the method comprising the steps of:
   (a) providing a housing comprising;
   a temperature sensor for sensing the temperature of said optical device inside said housing;
   a heat source mounted in a substantially horizontal orientation inside said housing for generating heat; and,
   a heat transfer medium, disposed between said heat source and said optical device, having an array of heat pipes located inside thereof, wherein each of said heat pipes comprises a sealed vessel containing a working fluid and wicks, said wicks provide for condensing said working fluid and for evaporating said condensed working fluid in response to said generated heat;

(b) applying voltage to said heat source to generate heat;

(c) transferring said generated heat inside said heat pipes to evaporate the working fluid in a condensed state inside said wicks; and, (d) uniformly distributing said evaporated working fluid into said heat pipes for heating said heat transfer plate.

13. The method of claim 12, further comprising the step of (e) cooling said evaporated working fluid to return to said condensed state inside said wicks.

14. The method of claim 12, repeating said steps (b) through (e) upon receiving a request to control the heat distribution of said optical device.

* * * * *